(12) United States Patent
Dwyer et al.

(10) Patent No.: US 6,341,365 B1
(45) Date of Patent: Jan. 22, 2002

(54) METHOD FOR AUTOMATING THE PLACEMENT OF A REPEATER DEVICE IN AN OPTIMAL LOCATION, CONSIDERING PRE-DEFINED BLOCKAGES, IN HIGH FREQUENCY VERY LARGE SCALE INTEGRATION/ULTRA LARGE SCALE INTEGRATION (VLSI/ULSI) ELECTRONIC DESIGNS

(75) Inventors: Robert P. Dwyer, New Paltz; Peter J. Camporese, Hopewell Junction, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/396,327

(22) Filed: Sep. 15, 1999

(51) Int. Cl.[7] ............................................... G06F 17/50
(52) U.S. Cl. ........................ 716/8; 716/2; 716/6; 716/9
(58) Field of Search ................................ 716/2, 8, 9, 6

(56) References Cited

U.S. PATENT DOCUMENTS 6,030,110 A * 2/2000 Scepanovic et al. ........... 716/6
6,025,571 A1 * 3/2001 Camporese et al. ........... 716/2

OTHER PUBLICATIONS

Cao, et al., Effects of Global Interconnect Optmizations on Performance Estimation of Deep Submicron Design; IEEE Conference on CAD; pp. 56–61; 2000.*

Shah, et al., "Wiresizing with Buffer Placement and Sizing for Power–Delay Tradeoffs"; Ninth International Conference on VLSI Design; pp. 346–351; 1996.*

Kahng, et al., "Interconnect Otimization Strategies for High–Performance VLSI Devices"; Twelfth International Conference on VLSI Design; pp. 464–469; 1999.*

* cited by examiner

Primary Examiner—Carl Whitehead, Jr.
Assistant Examiner—Jibreel Speight
(74) Attorney, Agent, or Firm—Lynn Augspurger; Cantor Colburn LLP

(57) ABSTRACT

A method (and a system for using the method) for placing a semiconductor circuit device between a driver and one or more receivers on the floor space of a chip. The method includes the steps of: determining respective distances between the driver and each of the one or more receivers; determining a shortest of the distances; determining midpoint along the shortest distance; determining whether the midpoint is predesignated to the floor space of one or more blocking semiconductor circuit devices; placing the repeater at the midpoint if the midpoint is not predesignated to the one or more blocking semiconductor circuit devices; and applying a backoff algorithm to incrementally back away from the midpoint to an optimal location, and placing the repeater at the optimal location, if the midpoint is predesignated to the one or more blocking semiconductor circuit devices. The method can also include the steps of: determining whether the to be placed semiconductor circuit device can be placed at a set of incremental locations located along one or more axes away from the midpoint; and placing the to be placed semiconductor circuit device at one of the one or more acceptable incremental locations. The step of determining the set of incremental locations can be performed in a spiral pattern away from the midpoint. The semiconductor circuit device to be placed can be, for example, a repeater along the path of a net (length of wire) to regenerate a propagated signal.

14 Claims, 4 Drawing Sheets

METHOD FOR AUTOMATING THE PLACEMENT OF A REPEATER DEVICE IN AN OPTIMAL LOCATION, CONSIDERING PRE-DEFINED BLOCKAGES, IN HIGH FREQUENCY VERY LARGE SCALE INTEGRATION/ULTRA LARGE SCALE INTEGRATION (VLSI/ULSI) ELECTRONIC DESIGNS

FIELD OF THE INVENTION

The following invention relates generally to signal transmission in Very Large Scale Integration/Ultra Large Scale Integration (VLSI/ULSI) systems and specifically to repeater device placement process and method for improving signal transmission performance and electrical integrity.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

A typical problem in implementing high performance in semiconductor circuits (chips) is accurately transmitting a signal along the length of a metal connector (called a net) traversing relatively long distances on the chips. An additional problem is maintaining an acceptable signal voltage transition rate along the length of the net. The net can be a piece or strip of metal (e.g., copper) acting as a transmission medium and traversing the length or nearly the length of the chip. This signal voltage transition rate is also called a slew rate or signal slew rate.

A poor signal slew rate has several detrimental effects which impact the overall performance and electrical integrity of the digital circuit. The performance of a digital circuit is degraded by a poor signal slew rate in several ways: the propagation delay of a signal with poor slew rate is increased and the propagation delay of the next stage in the circuit is also degraded by the slower switching rate at the input. The electrical integrity of the circuit is adversely effected since a poor slew rate at the input of a circuit is more susceptible to being effected by electrical noise which can come in the form of coupled line (or wire) noise or power supply noise. A solution to poor signal slew rates in the interconnect of digital circuits is to provide one or more buffers (or repeaters) along the interconnect wire(s) to allow repowering of the electrical signals which in effect increases the slew rate and reduces the switching time. In a typical high performance VLSI circuit design implementation the analysis of the performance of the system required to determine the slew rate of each signal is performed once the overall floorplan and placement of the devices is known. Once the floorplan and device placement is known the parasitic loading (resistive, capacitive and inductive characteristics of the circuit interconnect) can be evaluated and used as input to estimate or simulate performance. Once the performance of each net in the system is evaluated the nets with poor slew rates can be identified. Once these nets are identified the corrective action of buffer insertion can be applied. What is required is a means for placement of the repowering buffers to correct poor signal slew rates within a given digital VLSI circuit design with a known floorplan and device placement.

A typical net may have a length on the order of 17 millimeters, which is the length of a typical chip, and comprise a number of different layers, such as 6 layers of metal, all insulated from one another vertically and horizontally. The width of a net is on the order of less than one micron.

The signal is typically either a low or high voltage signal. The circuit element transmitting the signal is called the driver. The circuit element receiving the signal is called a receiving device or receiver. The net transmits the signal from the driver to the receiving device. The trouble is that the longer the length of the net between the driver and the receiving device, the more difficult it is to recapture an accurate, sharp signal at the receiving end, and the more difficult it is to have an unaffected slew rate for propagation of the electrical signal.

In a typical chip, the clock rate is about 1 nanosecond. A good slew rate is considered to be approximately 40% or less than the clock rate, or 400 picoseconds or less. The longer the length of the net, the more adversely the net is impacted.

If the propagation delay is slow, then the propagation delay for the receiving circuit is degraded. Also, if a signal propagates slowly, then the net is susceptible to electrical noise caused by capacitive coupling with neighboring wires, or other parasitic effects.

For this reason, repeaters are provided along the path of the net to regenerate the signal. The repeater is called a buffer device.

The ideal location for the repeater is at a midpoint between the driver and the receiving device. Unfortunately, this midpoint is often occupied by other devices on the chip, called predefined blockages, because their floor space on the chip has been predefined by designers. Finding the midpoint is not a trivial task, because there may be more than one receiving device, to which the signal on the net propagates. Manually searching for an optimal point to place the repeater is disadvantageous because it is time consuming, considering the number of repeaters that may be required.

What is required is an automatic method for providing an optimal point in which to place the repeater along a net traversing a long distance relative to a chip.

SUMMARY OF THE INVENTION

The present invention is directed to a method, and a system for using the method, for placing a semiconductor circuit device between a driver and one or more receivers on the floor space of a chip.

The method includes the steps of: determining respective distances between the driver and each of the one or more receivers; determining a shortest of the distances; determining midpoint along the shortest distance; determining whether the midpoint is predesignated to the floor space of one or more blocking semiconductor circuit devices; placing the repeater at the midpoint if the midpoint is not predesignated to the one or more blocking semiconductor circuit devices; and applying a backoff algorithm to incrementally back away from the midpoint to an optimal location, and placing the repeater at the optimal location, if the midpoint is predesignated to the one or more blocking semiconductor circuit devices.

The method can also include the steps of: determining whether the to be placed semiconductor circuit device can be placed at a set of incremental locations located along one or more axes away from the midpoint; and placing the to be placed semiconductor circuit device at one of the one or more acceptable incremental locations. The step of determining the set of incremental locations can be performed in a spiral pattern away from the midpoint. This can include determining a subset of locations of the set of incremental locations positioned outside the floor space of the blocking semiconductor devices; and placing the semiconductor device at one of the subset of locations located along a shortest path between the driver and the receiver located closest to the driver.

The semiconductor circuit device to be placed can be a repeater along the path of a net. The driver can be a semiconductor device. The driver can be a group of semiconductor devices. The one or more receivers can be one or more semiconductor devices. The one or more receivers can be one or more groups of semiconductor devices.

The repeater device can include: two pairs of circuit elements, each pair comprising an n-doped field effect transistor (NFET) and p-doped field effect transistor (PFET) coupled together, wherein the pairs are coupled together in a non-inverting circuit.

BRIEF DESCRIPTION OF THE DRAWINGS

The foregoing and other features and advantages of the invention will be described with reference to the accompanying drawings. In the drawings, like reference numbers generally indicate identical, functionally similar, and/or structurally similar elements.

DETAILED DESCRIPTION OF THE INVENTION

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
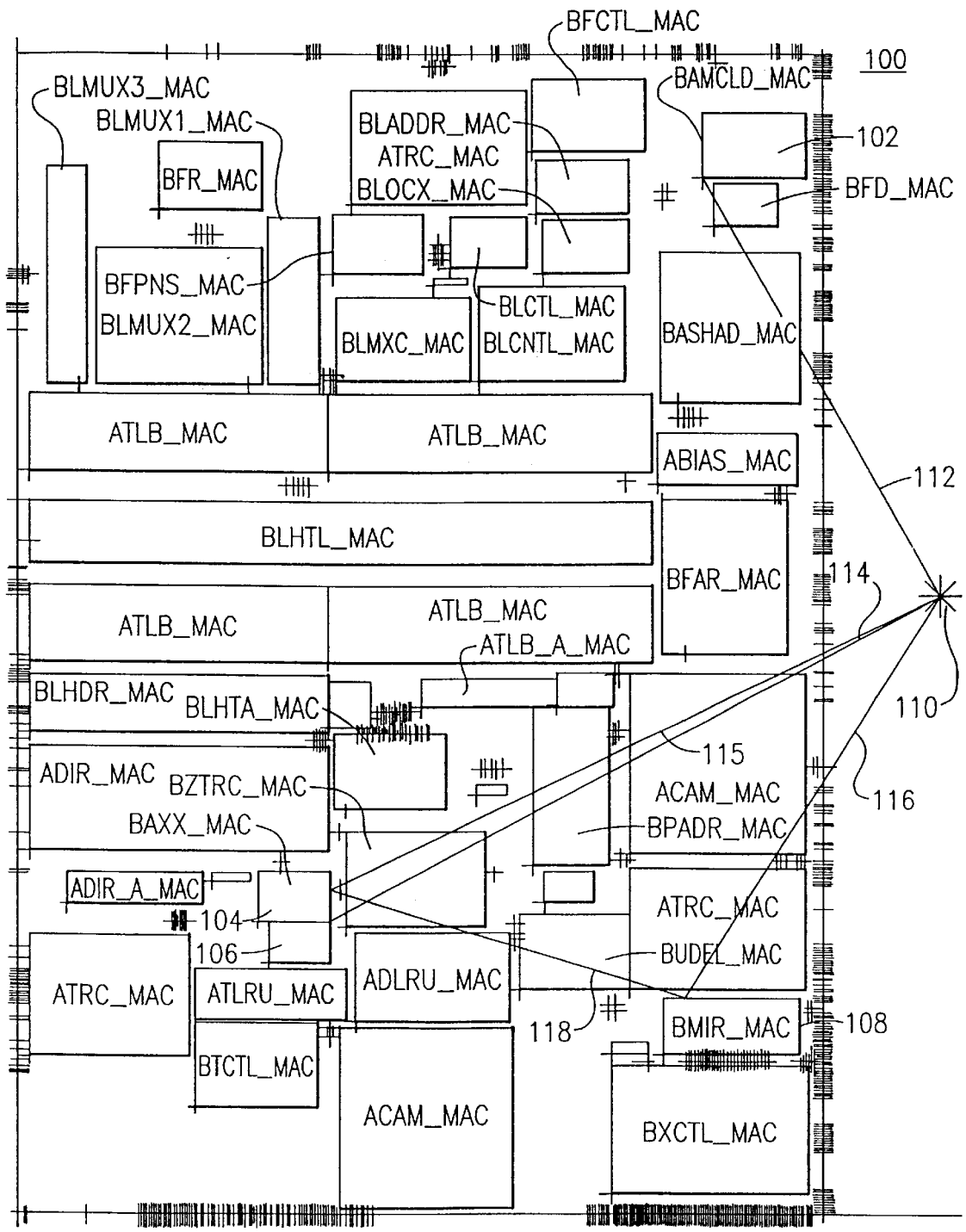
FIG. 1 illustrates an exemplary semiconductor circuit.

FIG. 1 illustrates an exemplary semiconductor circuit (chip) 100. Semiconductor circuit 100 includes a plurality of semiconductor devices or groups of semiconductor devices, of which semiconductor devices (or groups) 102, 104, 106 and 108 are labeled. Semiconductor device 102 is a driver, because it generates an electrical signal. Semiconductor devices 104, 106 and 108 are the receiving devices (or receivers) because they receive an electrical signal from driver 102.

Also symbolically illustrated is a repeater 110. In one embodiment, repeater 110 is made of two inverters coupled together, where each inverter is made of an n-doped field effect transistor (NFET) and a p-doped field effect transistor (PFET) coupled together. Each node in the buffer holds a high or low voltage, and therefore two nodes (each comprising an NFET and a PFET pair) are required to invert the signal and then invert it once again, to recapture the original signal. The purpose of repeater 110 is to regenerate the electrical signal transmitted by driver 102. Repeater 110 is being illustrated symbolically because it has not yet been placed on the floor space of chip 100.

A wire has not yet been routed between driver 102 and receivers 104, 106 and 108. It is therefore referred to as a net, and not a wire. The portion of the net, or path, from driver 102 to repeater 110 is labeled 112. The portion of the net from repeater 110 to receiver 104 is labeled 114. The portion of the net from repeater 110 to receiver 106 is labeled 115. The portion of the net from repeater 110 to receiver 108 is labeled 116.

Also illustrated is a path 118 from semiconductor device 108 to semiconductor device 104. It is important to note that 104, 106 and 108 are all receiving circuits that must eventually be joined together by wires.

Figure 2:
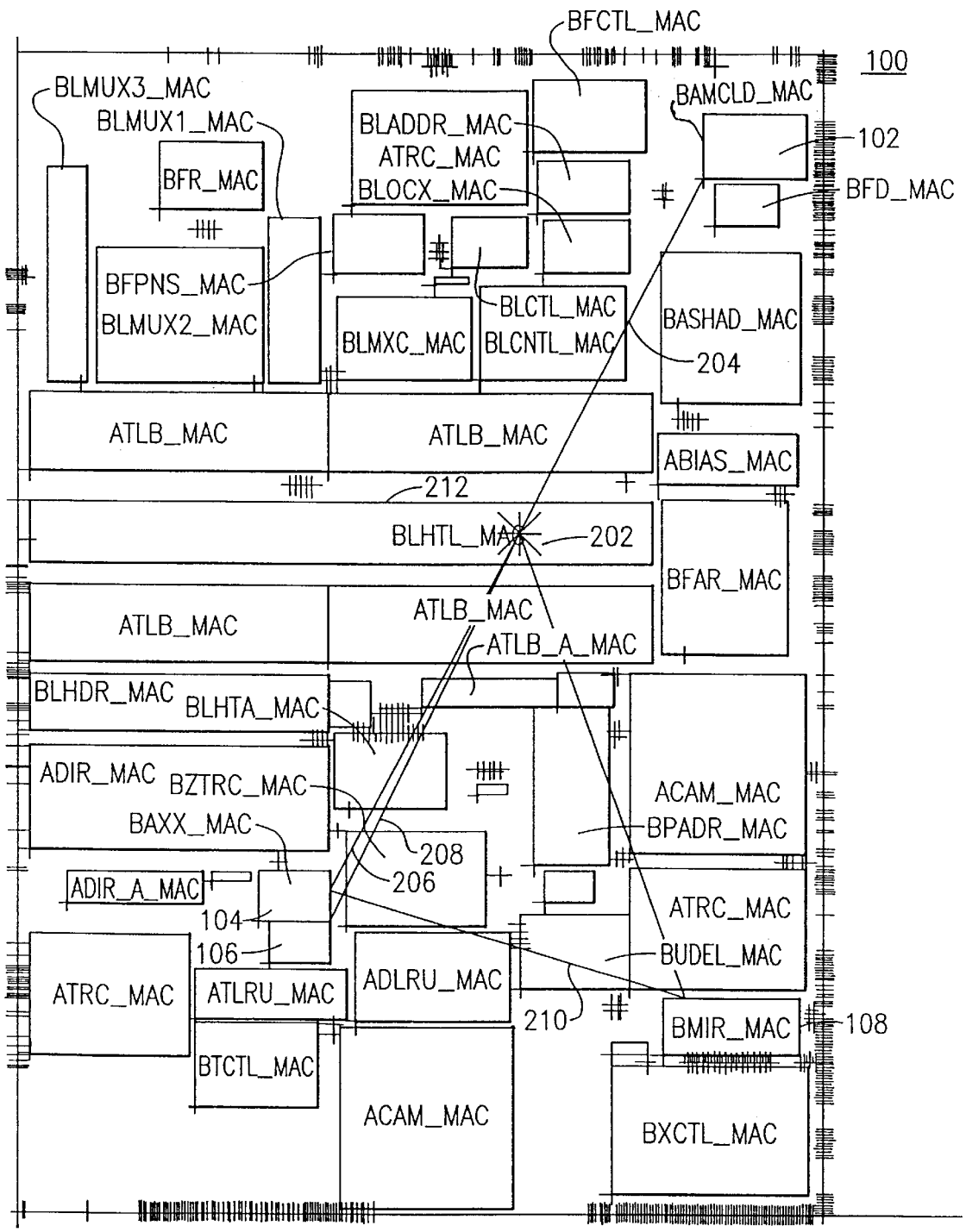
FIG. 2 illustrates an exemplary semiconductor circuit with a first part of the inventive algorithm applied thereto.

FIG. 2 illustrates an exemplary chip 100 with a first part of the inventive algorithm applied. In the first part of the inventive algorithm, the distances from the driver to the receivers are calculated individually. In one embodiment, the algorithm, itself, is written in Cadence SKILL, as used on an S/390's 2000 CP (chip platform) machine.

Next, the midpoint of the shortest distance (from driver 102 to the closest receiver) is taken as the optimum point to place repeater 110. Here, the optimum point of placement is location 202. The path from driver 102 to the optimal location 202 is labeled 204. The paths from optimal location 202 to receivers 104, 106 are respectively labeled 206 and 208. Here, a straight path from driver 102 to receiver 104 is determined to be the shortest distance. Along this shortest distance, the midpoint is location 202.

Unfortunately, location 202 resides in floor space reserved by design for another semiconductor device 212. Because of this, repeater 110 cannot be placed at location 202.

Accordingly, a second part of the inventive algorithm is applied. Here, a spiral backoff algorithm is applied to find the closest location outside the floor space of semiconductor device 212 to place repeater 110. The spiral backoff algorithm is described in detail below.

Figure 3:
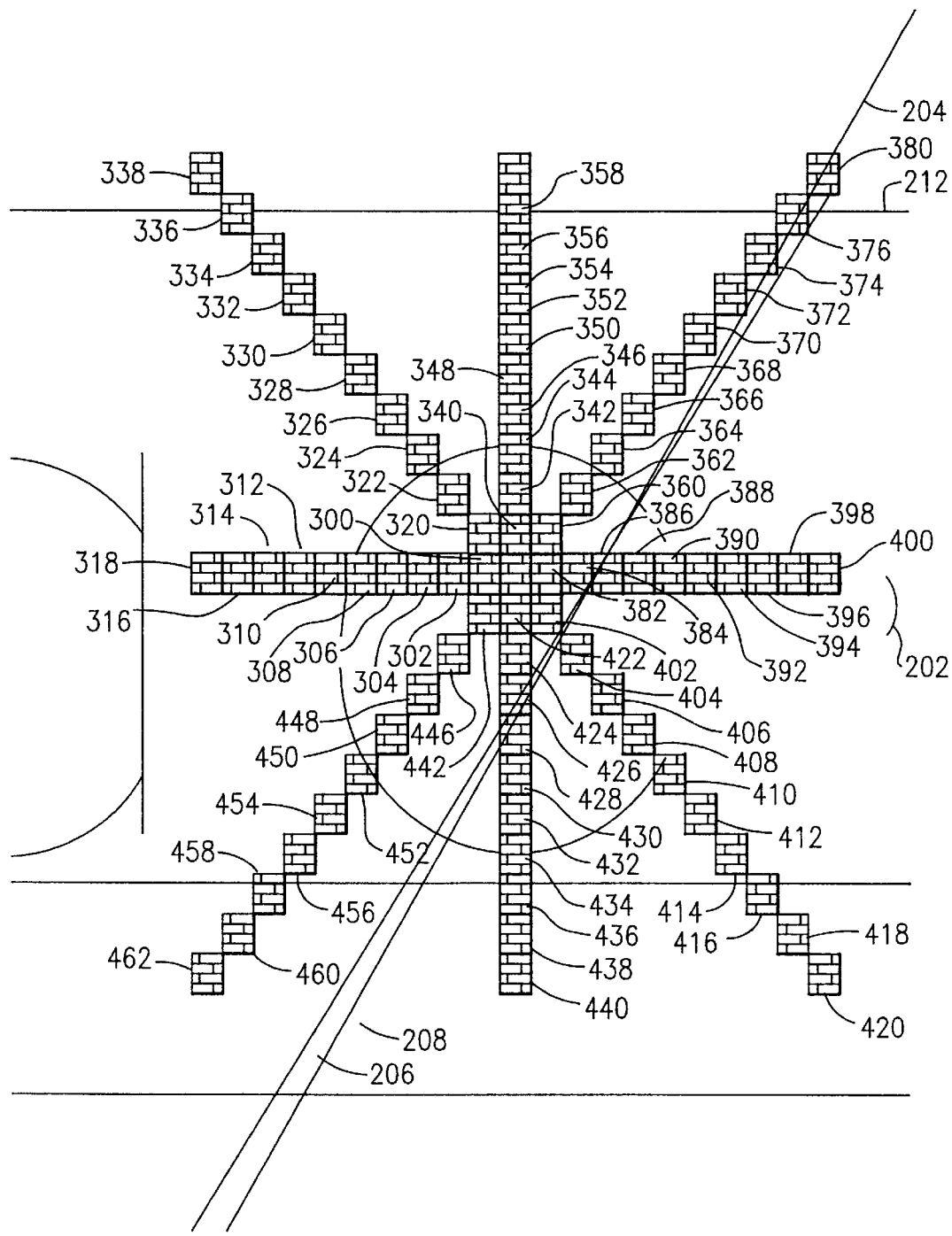
FIG. 3 illustrates the floor space of a semiconductor device blocking where a repeater should be placed.

FIG. 3 illustrates the floor space of semiconductor device 212 in greater detail. From the center of semiconductor device 212, incremental portions are laid out in eight directions. From location 202, incremental portions 300, 302, 304, 306, 308, 310, 312, 314, 316, 318 are laid out in the −x direction.

Incremental portions 320, 322, 324, 326, 328, 330, 332, 334, 336, 338 are laid out in the −x/+y direction.

Incremental portions 340, 342, 344, 346, 348, 350, 352, 354, 356, 358 are laid out in the +y direction.

Incremental portions 360, 362, 364, 366, 368, 370, 372, 374, 376, 378, 380 are laid out in the +x/+y direction.

Incremental portions 382, 384, 386, 388, 390, 392, 394, 396, 398, 400 are laid out in the +x direction.

Incremental portions 402, 404, 406, 408, 410, 412, 414, 416, 418, 420 are laid out in the +x/−y direction.

Incremental portions 422, 424, 426, 428, 430, 432, 434, 436, 438, 440 are laid out in the −y direction.

Incremental portions 442, 444, 446, 448, 450, 452, 454, 456, 458, 460, 462 are laid out in the −x/−y direction.

The dimensions of the above incremental portions depend upon the parameters acceptable to the device placement tool (such as overall accuracy), as well as other parameters recognized to those having skill in the art. The incremental portions in each of the above directions can be extended ad infinitum.

Figure 4:
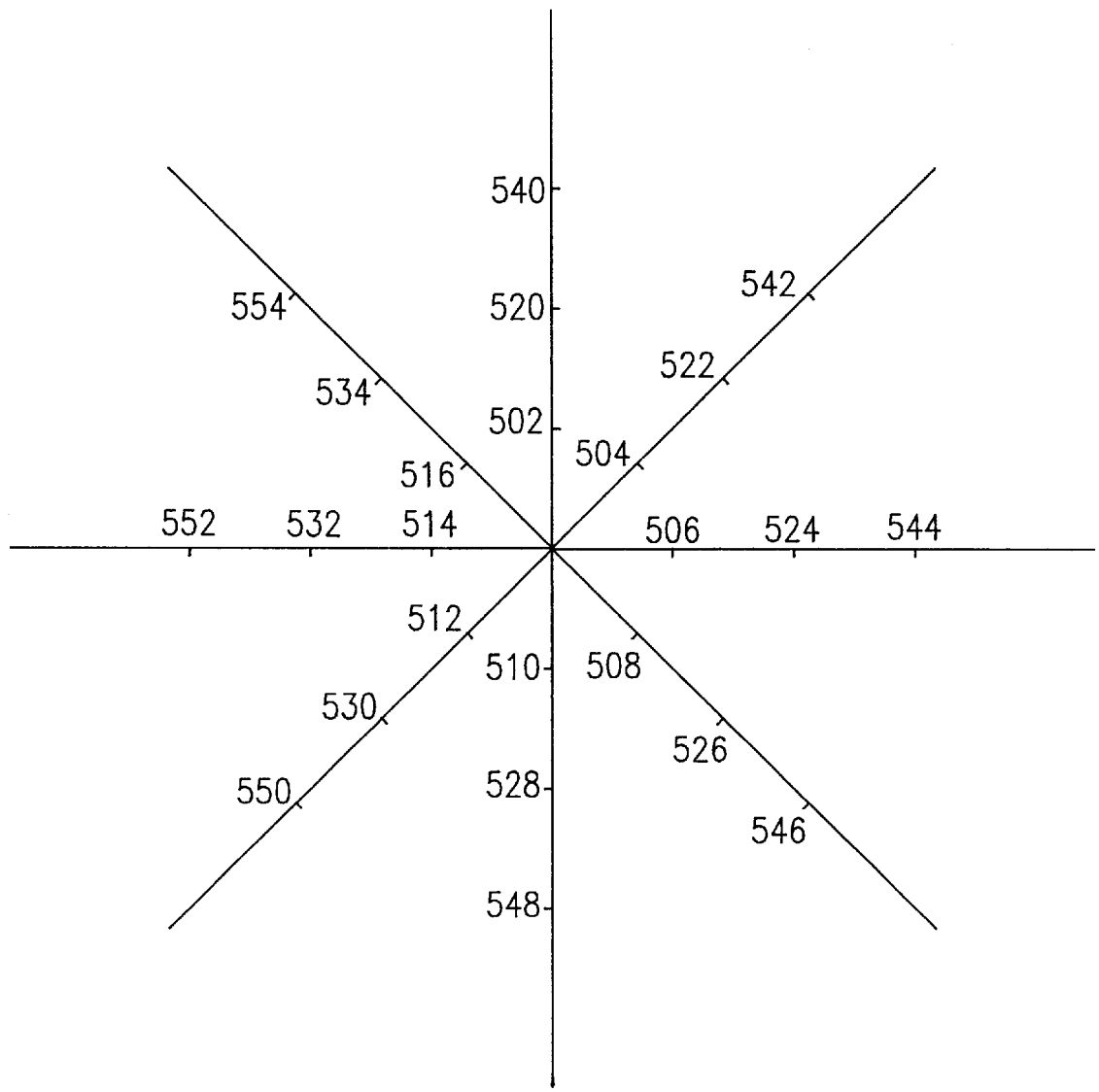
FIG. 4 illustrates a symbolic illustration of one embodiment for repeater placement using a spiral backoff algorithm.

FIG. 4 is a symbolic illustration of one embodiment for repeater placement, specifically the spiral backoff algorithm. In FIG. 4: elements 502, 520, 540 respectively represent the placement of the repeater in the +y direction; elements 504, 522, 542 respectively represent the placement of the repeater in the +x/+y direction; elements 506, 524, 544 respectively represent the placement of the repeater in the +x direction; elements 508, 526, 546 respectively represent the placement of the repeater in the +x/−y direction; elements 510, 528, 548 respectively represent the placement of the repeater in the −y direction; elements 512, 530, 550 respectively represent the placement of the repeater in the −x/−y direction; elements 514, 532, 552 respectively represent the placement of the repeater in the −x direction; and elements 516, 534, 554 respectively represent the placement of the repeater in the −x/+y direction.

The order of placement delimited sequentially. After it is determined that repeater 100 cannot be placed at location 202 (located at the center of FIG. 4, where the directional axes cross), the algorithm follows a spiral succession to find the first locations (incremental portions) to place repeater 110. In other words, first location 502 (representing incremental portion 340) is observed, next location 504 (representing incremental portion 360) is observed, next location 506 (representing incremental portion 382) is observed, next location 508 (representing incremental portion 402) is observed, next location 510 (representing incremental portion 422) is observed, next location 512 (representing incremental portion 442) is observed, next location 514 (representing incremental portion 300) is observed, next location 516 (representing incremental portion 320) is observed, next location 520 (representing incremental portion 342) is observed, next location 522 (representing incremental portion 362) is observed, etc. Thus the tool follows a spiral pattern away from the original locus location 202.

In one embodiment, once the first location outside semiconductor device 212 is located, that point is taken as the floor space for repeater 110.

In another embodiment, a collection of points located outside of semiconductor device 212 are determined, for example 10, or any number of points desired by a user. From this set of points, it is determined which point is along the shortest path from driver 102 to the closest receive 104. This point is taken as the floor space location for repeater 110.

Although the above describes the use of a spiral pattern, this should not be taken as limiting the invention. As those skilled in the art will recognize, any variety of patterns may be used to determine an optimal location. In addition, any number of location axes can be used, not just +y, +x/+y, +x, +x/−y, −y, −x/−y, −x, −x/+y. In addition, the process can begin at the outer edges (for example, at incremental portion 358) and work inward, or begin at the inner edges and work a combination of inward and outward, or begin at the outer edges and work a combination of inward and outward, or begin at middle portions (for example, at incremental portion 388) and work a combination of inward and outward, etc. The process can also begin at any defined axis, such as the −x/−y axis, or any other axes perceived by those skilled in the art.

While the invention has been particularly shown and described with reference to preferred embodiments thereof, it will be understood by those skilled in the relevant art that various changes in form and details may be made therein without departing from the spirit and scope of the invention.

What is claimed is:

1. A method for placing a semiconductor circuit device between a driver and one or more receivers on the floor space of a chip, comprising the steps of:
    determining respective distances between said driver and each of said one or more receivers;
    determining a shortest of said distances;
    determining midpoint along said shortest distance;
    determining whether said midpoint is predesignated to the floor space of one or more blocking semiconductor circuit devices;
    placing said repeater at said midpoint if said midpoint is not predesignated to said one or more blocking semiconductor circuit devices; and
    applying a backoff algorithm to incrementally back away from said midpoint to an optimal location, and placing said repeater at said optimal location, if said midpoint is predesignated to said one or more blocking semiconductor circuit devices.

2. The method according to claim 1, comprising the steps of:
    determining whether said to be placed semiconductor circuit device can be placed at a set of incremental locations located along one or more axes away from said midpoint; and
    placing said to be placed semiconductor circuit device at one of said one or more acceptable incremental locations.

3. The method according to claim 2, wherein the step of determining said set of incremental locations is performed in a spiral pattern away from said midpoint.

4. The method according to claim 3, comprising:
    determining a subset of locations of said set of incremental locations positioned outside the floor space of said blocking semiconductor devices; and
    placing said semiconductor device at one of said subset of locations located along a shortest path between said driver and one of said receivers located closest to said driver.

5. A system for placing a semiconductor circuit device between a driver and one or more receivers on the floor space of a chip comprising:
    means for determining respective distances between said driver and each of said one or more receivers;
    means for determining a shortest of said distances;
    means for determining midpoint along said shortest distance;
    means for determining whether said midpoint is predesignated to the floor space of one or more blocking semiconductor circuit devices;
    means for placing said repeater at said midpoint if said midpoint is not predesignated to said one or more blocking semiconductor circuit devices; and
    means for applying a backoff algorithm to incrementally back away from said midpoint to an optimal location, and placing said repeater at said optimal location, if said midpoint is predesignated to said one or more blocking semiconductor circuit devices.

6. The system according to claim 5, comprising:
    means for determining whether said to be placed semiconductor circuit device can be placed at a set of incremental locations located along one or more axes away from said midpoint; and means for placing said to be placed semiconductor circuit device at one of said one or more acceptable incremental locations.

7. The system according to claim 6, comprising:

means for determining said set of incremental locations in a spiral pattern away from said midpoint.

8. The system according to claim 7, comprising:

means for determining a subset of locations of said set of incremental locations positioned outside the floor space of said blocking semiconductor devices; and means for placing said semiconductor device at one of said subset of locations located along a shortest path between said driver and one of said receivers located closest to said driver.

9. The system according to claim 5, wherein the semiconductor circuit device to be placed is a repeater along the path of a net.

10. The system according to claim 5, wherein the driver is a semiconductor device.

11. The system according to claim 5, wherein the driver is a group of semiconductor devices.

12. The system according to claim 5, wherein the one or more receivers are one or more semiconductor devices.

13. The system according to claim 5, wherein the one or more receivers are one or more groups of semiconductor devices.

14. The system according to claim 5, wherein the repeater comprises:

two pairs of circuit elements, each said pair comprising an n-doped field effect transistor (NFET) and p-doped field effect transistor (PFET) coupled together, wherein said pairs are coupled together in a non-inverting circuit.

* * * * *

UNITED STATES PATENT AND TRADEMARK OFFICE
CERTIFICATE OF CORRECTION

PATENT NO.   : 6,341,365 B1
DATED        : January 22, 2002
INVENTOR(S)  : Dwyer et al.

It is certified that error appears in the above-identified patent and that said Letters Patent is hereby corrected as shown below:

Title page,
Item [56], References Cited, U.S. PATENT DOCUMENTS, delete "6,025,571 A1" and insert therefor -- 6,205,571 A1 --
OTHER PUBLICATIONS, after "Interconnect" (first occurrence) delete "Optmizations" and insert therefor -- Optimizations --

Signed and Sealed this

Fourteenth Day of June, 2005

JON W. DUDAS
*Director of the United States Patent and Trademark Office*